(12) United States Patent
Boettcher et al.

(10) Patent No.: US 10,658,274 B2
(45) Date of Patent: May 19, 2020

(54) ELECTRONIC DEVICE

(71) Applicant: NEXPERIA B.V., Nijmegen (NL)

(72) Inventors: Tim Boettcher, Hamburg (DE); Haibo Fan, Kwai Chung (HK); Wai Wong Chow, Kwai Chung (HK); Pompeo V. Umali, Kwai Chung (HK); Shun Tik Yeung, Kwai Chung (HK); Chi Ho Leung, Kwai Chung (HK)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 16/221,723

(22) Filed: Dec. 17, 2018

(65) Prior Publication Data

US 2019/0189545 A1 Jun. 20, 2019

(30) Foreign Application Priority Data

Dec. 20, 2017 (EP) .................................... 17209137

(51) Int. Cl.
*H01L 21/00* (2006.01)
*H01L 23/495* (2006.01)
*H01L 23/00* (2006.01)

(52) U.S. Cl.
CPC .. *H01L 23/49562* (2013.01); *H01L 23/49513* (2013.01); *H01L 23/49517* (2013.01); *H01L 23/49524* (2013.01); *H01L 24/37* (2013.01); *H01L 24/40* (2013.01); *H01L 24/84* (2013.01); *H01L 24/32* (2013.01); *H01L 24/73* (2013.01);
(Continued)

(58) Field of Classification Search
CPC ......... H01L 23/49562; H01L 23/49517; H01L 24/40
See application file for complete search history.

(56) References Cited

U.S. PATENT DOCUMENTS 9,171,788 B1 * 10/2015 Xue ....................... H04L 24/38
2007/0176266 A1 8/2007 Kawano et al.
(Continued)

FOREIGN PATENT DOCUMENTS

CN 110021576 A * 7/2019 ....... H01L 23/49562
EP 3503179 A1 * 6/2019 ............. H01L 24/37
(Continued)

OTHER PUBLICATIONS

European Search Report and Written Opinion for the corresponding European application EP 17209137.3, dated May 25, 2018, 9 pages.

*Primary Examiner* — Laura M Menz
(74) *Attorney, Agent, or Firm* — Ohlandt, Greeley, Ruggiero & Perle, L.L.P.

(57) ABSTRACT

An electronic device including a die and at least one lead. The electronic device further includes a corresponding at least one connector, each connector for connecting the die to a corresponding lead or leads, and each connector having a first end disposed in bondable proximity to a complementary surface of the corresponding lead and a second end disposed in bondable proximity to a complementary surface of the die. An end portion of at least one of the first end and second end has a formation, the formation in combination with the complementary surface of one, or both, of the respective lead or the die defining therebetween a first region and at least a second region configured to attract by capillary action an electrically conductive bonding material to consolidate therein.

14 Claims, 9 Drawing Sheets

(52) U.S. Cl.
CPC ............ *H01L 2224/32245* (2013.01); *H01L 2224/37* (2013.01); *H01L 2224/37013* (2013.01); *H01L 2224/4009* (2013.01); *H01L 2224/40245* (2013.01); *H01L 2224/73263* (2013.01); *H01L 2224/83801* (2013.01); *H01L 2224/84345* (2013.01); *H01L 2224/84801* (2013.01); *H01L 2224/84855* (2013.01); *H01L 2924/1203* (2013.01); *H01L 2924/3512* (2013.01)

(56) References Cited

U.S. PATENT DOCUMENTS

| | | | | |
|---|---|---|---|---|
| 2016/0365305 | A1* | 12/2016 | Ding | ............... H01L 21/52 |
| 2018/0331022 | A1* | 11/2018 | Qin | ............... H01L 21/4842 |
| 2019/0139873 | A1* | 5/2019 | Saito | ............... H01L 21/4825 |
| 2019/0189544 | A1* | 6/2019 | Yandoc | ............ H01L 23/49575 |
| 2019/0189545 | A1* | 6/2019 | Boettcher | ......... H01L 23/49513 |

FOREIGN PATENT DOCUMENTS

| | | | | |
|---|---|---|---|---|
| JP | S63170961 | * | 10/1987 | ............ H04L 23/48 |
| JP | S63170961 U | | 11/1988 | |
| JP | 2012104708 A | | 5/2012 | |
| JP | 2012109303 A | | 6/2012 | |

\* cited by examiner

ELECTRONIC DEVICE

CROSS REFERENCE TO RELATED APPLICATION

The present application claims foreign priority to European Patent Application No. EP17209137.3 filed on Dec. 20, 2017 the entirety of which is incorporated by reference hereby.

FIELD

The invention relates to an electronic device. In particular, but not exclusively, the present invention relates to a connector, or clip, for connecting a die to a lead in an electronic device.

BACKGROUND

FIG. 1a shows a cross-sectional view of a portion of an electronic device 100, for example a semiconductor device, comprising die support 102, electronic die (e.g., semiconductor chip) 104, connector, or clip, 106 and a lead 108 of a leadframe.

Die 104 is attached to die support 102 by bonding material 110. Contact 112 on die 104 is bonded to a die-end 114 of connector 106 by an electrically conductive bonding material 116, such as, for example, solder, sinter materials, conductive glue, or the like.

A lead-end 118 of connector 106 is bonded to a connector-pad 120, which comprises a planar region of lead 108, by electrically conductive bonding material 122 that may, again, comprise solder, sinter materials, conductive glue, or the like.

A portion of the lead-end 118 of connector 106 adjacent the connector-pad 120 is generally flat.

In electronic devices, it is essential that a solder joint does not comprise a so-called "dry joint" or "cold-solder joint" so as to ensure good electrical conduction between joined parts. Any defect in a solder joint can lead to a joint that is non-functional either immediately or after a period of use. Ideally a surface at a solder-atmosphere interface of a fillet of solder formed around a region where two parts to be joined meet is concave. Presence of a concave surface can reduce stress concentration at the surface of a solder joint, which may reduce the possibility of cracks forming in the solder and propagating through the solder.

Techniques have been developed to mimic the stresses that a solder joint will undergo during a period of use and these techniques employ repeated stressing and de-stressing of a component to induce failure through fatigue. One known example comprises temperature cycle testing, which comprises a process of cycling through temperature extremes, typically at relatively high rates of change to evaluate product reliability.

In the prior art arrangement illustrated in FIG. 1a, a concave surface of electrically conductive bonding material 122 is formed at a first end 124a of the connector-connector pad interface. However, a first article inspection revealed that a similar shaped surface is not formed at a second end 124b of the connector-connector pad interface, which is influenced by the shape of the end of the connector 16. That is, the joint is not symmetric.

In a thermal cycling test (TCT) of a joint of electrically conductive bonding material 122 as illustrated, the joint failed after 1000 cycles due to a mismatch in the coefficients of thermal expansion of the electrically conductive bonding material, e.g. an epoxy moulding compound, and the connector-pad 120 of lead 108. Failure was caused by a crack, which formed in the electrically conductive bonding material 122 at the second end 124b of the connector-connector pad interface, propagating through the electrically conductive bonding material 122.

To mitigate against the possibility of solder crack occurring in a solder joint arrangement such as that illustrated in FIG. 1a, a die-attach and clip-attach (DACA) process is optimised to provide a greater volume of solder on the connector-pad. However, possibility of solder crack occurring is still limited by shape and/or configuration of an end of connector 106. In a solder joint formed using such an optimised process, joint failure occurred after 2000 cycles in a TCT.

The present invention has been devised with the foregoing in mind.

SUMMARY

According to an aspect of the invention there is provided an electronic device comprising: a die; at least one lead; a corresponding at least one connector, the or each connector for connecting the die to a corresponding lead or leads, and the or each connector comprising a first end disposed in bondable proximity to a complementary surface of the corresponding lead and a second end disposed in bondable proximity to a complementary surface of the die; wherein an end portion of at least one of the first end and second end comprises a formation, the formation in combination with the complementary surface of one, or both, of the respective lead or the die defining therebetween a first region and at least a second region configured to attract by capillary action an electrically conductive bonding material to consolidate therein.

Such an electronic device may comprise bonding material of greater thickness, or volume, between connector and connector-pad (i.e. lead-end or on die), compared with known arrangements, while also keeping the overall footprint the same. This may increase the strength of the bonding joint, compared with known arrangements, because the bonding joint contains more bonding material and the elastic and plastic deformation during thermo-mechanic stresses may be reduced. Formation of a concave surface at a solder-atmosphere interface of a fillet of solder formed around a region where two parts to be joined meet may be promoted using a connector according to the present invention. Presence of a concave surface can reduce stress concentration at the surface of a solder joint, which may reduce the possibility of cracks forming in the solder and propagating through the solder.

Optionally, the formation at the first end may comprise a bend out of a plane of the connector such that a portion of the end portion of the first end extends in a direction out of the plane of the connector.

Optionally, the end portion of the first end may extend in a direction out of the plane of the connector away from the lead.

Optionally, the electronic device may further comprise a third region, wherein the second region and third region are located on either side of the first region, and further where the first region is partially defined by an apex of the bend and a portion of the complementary surface of the lead opposing the apex, the second region is partially defined by a first portion of the connector adjacent the apex and a portion of the complementary surface of the lead opposing the first portion, and the third region is partially defined by a second portion of the connector adjacent the apex and a portion of the complementary surface of the lead opposing the second portion.

Optionally, the formation at the first end may comprise a step formed in a tip of the first end, the step extending at least partly across a width of the first end, and further wherein the second region is partially defined by a first part of the step and a portion of the complementary surface of the lead opposing the first part, and the first region is partially defined by a second part of the step and a portion of the complementary surface of the lead opposing the second part.

Optionally, the formation at the first end may comprise peaks with a channel therebetween, the peaks and channel in a surface of the first end opposing the complementary surface of the corresponding lead and extending at least partly across a length of the first end, and further wherein the second region is partially defined by the channel and a portion of the complementary surface of the lead opposing the channel, and the first region is partially defined by the peaks and portions of the complementary surface of the lead opposing the peaks.

Optionally, the formation at the first end may comprise a bend out of a plane of the connector such that a first portion of the end region of the first end extends in a direction out of a plane of the connector toward the lead and a second portion of the end region of the first end, remote from the second end, extends in a direction out of a plane of the first portion away from the lead.

Optionally, the formation at the second end comprises a bend out of a plane of the connector such that a portion of the end region of the second end extends in a direction out of the plane of the connector.

Optionally, the end region of the second end may extend in a direction out of the plane of the connector away from the die.

Optionally, the electronic device may further comprise a third region, wherein the second region and third region are located on either side of the first region, and further where the first region is partially defined by an apex of the bend and a portion of the complementary surface of the die opposing the apex, the second region is partially defined by a first portion of the connector adjacent the apex and a portion of the complementary surface of the die opposing the first portion, and the third region is partially defined by a second portion of the connector adjacent the apex and a portion of the complementary surface of the die opposing the second portion.

Optionally, the formation at the second end may comprise a step formed in a tip of the second end, the step extending at least partly across a width of the second end, and further wherein the second region is partially defined by a first part of the step and a portion of the complementary surface of the die opposing the first part, and the first region is partially defined by a second part of the step and a portion of the complementary surface of the die opposing the second part.

Optionally, the formation at the second end may comprise peaks with a channel therebetween, the peaks and channel formed in a surface of the second end opposing the complementary surface of the corresponding lead and extending at least partly across a length of the second end, and further wherein the second region is partially defined by the channel and a portion of the complementary surface of the die opposing the channel, and the first region is partially defined by the peaks and portions of the complementary surface of the die opposing the peaks.

Optionally, the formation at the second end may comprise a bend out of a plane of the connector such that a first portion of the end region of the second end extends in a direction out of a plane of the connector toward the die and a second portion of the end region of the second end, remote from the first end, extends in a direction out of a plane of the first portion away from the die.

Optionally, the electronic device may comprise a power rectifier device or a transient voltage suppression device.

According to another aspect of the present invention, there is provided a connector for use in an electronic device as described above and hereinafter, the connector for connecting a die to a lead of the electronic device, the connector comprising a first end for disposition in bondable proximity to a complementary surface of the lead, and a second end for disposition in bondable proximity to a complementary surface of the die, wherein an end portion of at least one of the first and second ends comprises a formation, the formation in combination with the complementary surface of one, or both, of the respective lead or the die defining therebetween a first region and at least a second region configured to attract by capillary action an electrically conductive bonding material to consolidate therein.

DESCRIPTION OF THE DRAWINGS

One or more specific embodiments in accordance with aspects of the present invention will be described, by way of example only, and with reference to the following drawings in which:

FIG. 4c schematically illustrates a perspective view of a portion of the electronic device illustrated in FIG. 4a;

DESCRIPTION

Figure 2:
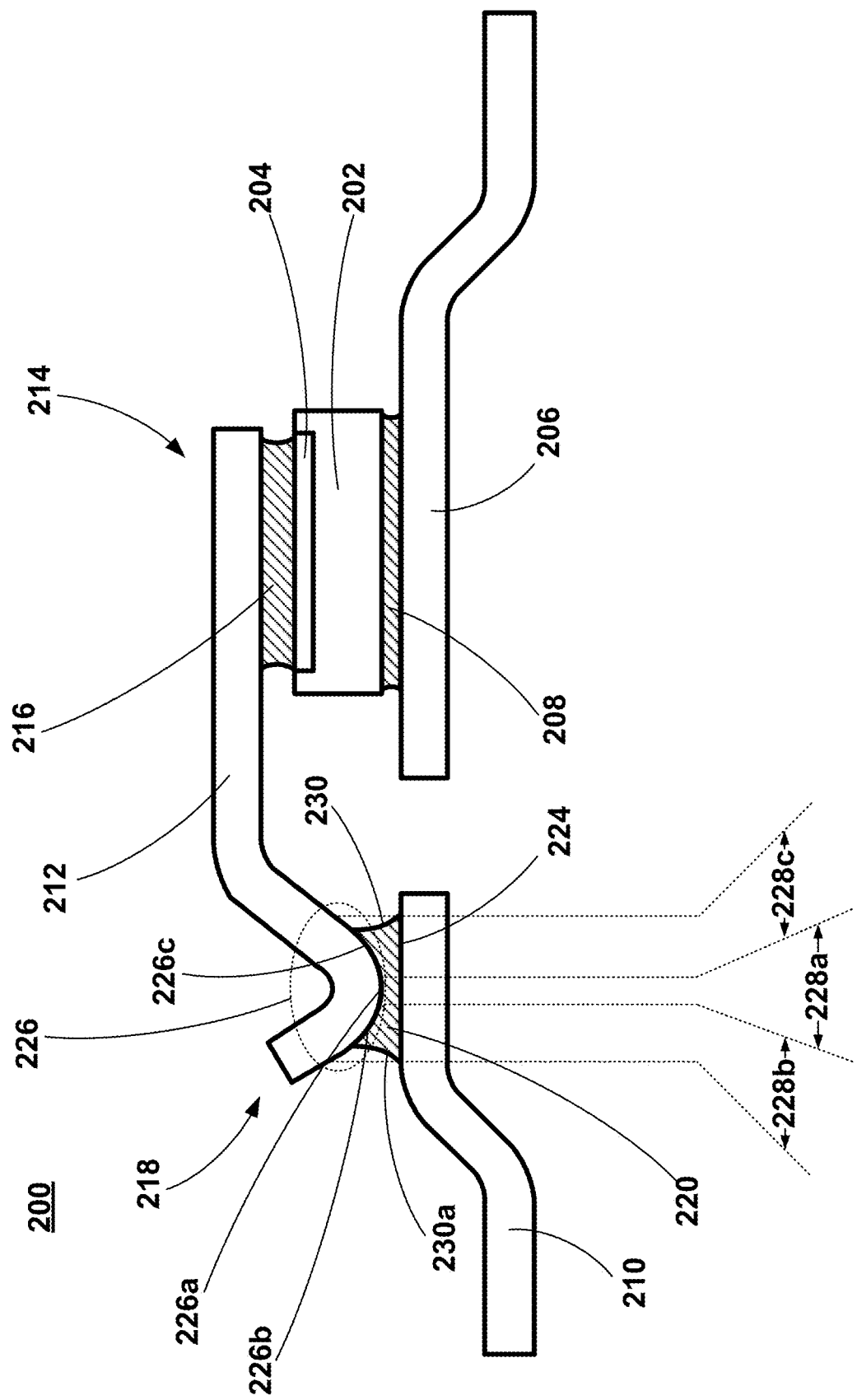
FIG. 2 schematically illustrates a cross-section view of a portion of an electronic device according to one or more embodiments of the present invention.

Referring now to FIG. 2, which illustrates a cross-section view of a portion of an electronic device 200 according to one or more embodiments of the present invention, die 202 having contact 204, is mounted on a die support 206 by bonding material 208. The bonding material 208 may be conductive or insulating, but an electrically conductive bonding material is frequently used when die support 206 is also intended to serve as one of the electrical leads of the device coupled to die 202.

Lead 210 is provided extending toward die 202 and is configured to serve as an external connection to die 202.

Connector, or clip, 212 extends from lead 210 to the contact 204 on die 202. A die-end 214 of connector 212 is attached to contact 204 of die 202 by electrically conductive bonding material 216. A lead-end 218 of connector 212 is attached to lead 210 by electrically conductive bonding material 220. An electrically conductive solder is an example of a suitable electrically conductive bonding material. The type of electrically conductive bonding materials 216, 220 employed should be capable of being liquefied, in order to flow in an un-set state (e.g. when heated), and further capable of hardening to a set state.

In a bonding process, it is desirable that the electrically conductive bonding materials 216, 220 have a common liquification or melting temperature so that they be temporarily, at least partially, liquid at the same time during a period of the bonding process. That is, it is desirable that the electrically conductive bonding materials 216, 220 have a common state, e.g., a temperature range or curing or bonding condition or the like, where they are semi-solid or at least partially liquid.

During the bonding process, the electrically conductive bonding materials 216, 220 should be sufficiently liquid that the connector 212 can float on the electrically conductive bonding material 216, 220 when the electrically conductive bonding material 216, 220 is in a semi-solid, partially liquid, or liquid state, and be free to move with respect to die 202 and lead 210 so as to "sink" into the electrically conductive bonding material 216, 220. After connector 212, die 202 and lead 210 have been arranged with the electrically conductive bonding materials 216, 220 therebetween, the electrically conductive bonding materials 216, 220 are temporarily liquefied, or temporarily maintained as liquids, to permit connector 212 to float on liquified electrically conductive bonding materials 216, 220, so that the connector 212, die 202 and lead 210 self-align by surface tension.

A material of the electrically conductive bonding material 216, 220 should be capable of flowing in order to readily wet the ends of the connector 212 and respective complementary surfaces of the die 202 and the lead 210. The complementary surface of the die 202 comprises contact 204 and the complementary surface of the lead 210 comprises a connector-pad 224 region of lead 210.

In the illustrated electronic device 200 of FIG. 2, the lead-end 218 of connector 212 comprises a bend formation 226. The bend formation 226 in combination with the complementary surface defined by connector-pad 224 of lead 210 define therebetween a region into which the electrically conductive bonding material 220 can flow (when in a liquid state) and harden. The arrangement of the bend formation 226 and opposing portion of the complementary surface serves to attract, by capillary action, the electrically conductive bonding material 220 into the region therebetween. This causes the electrically conductive bonding material 220, when in a liquid state, to flow into the space and consolidate around the bend formation 226 and the complementary surface defined by connector-pad 224.

As illustrated in FIG. 2, the bend formation 226 comprises a bend out of a plane of the connector 212 such that a portion of the lead-end 218 extends in a direction out of the plane of the connector 212 away from the lead 210.

A volume partially bounded by the bend formation 226 and a portion of the complementary surface defined by the connector-pad 224 that opposes the bend formation 226 comprises three regions. These three regions comprise: a first region 228a partially defined by an apex 226a of the bend formation 226 and a portion of the complementary surface of the lead 210 opposing the apex; a second region 228b partially defined by a first portion 226b of the connector 212 adjacent the apex 226a and a portion of the complementary surface of the lead opposing the first portion 226b; and a third region 228c partially defined by a second portion 226c of the connector adjacent the apex 226a and a portion of the complementary surface of the lead opposing the second portion 226c.

Figure 1A:
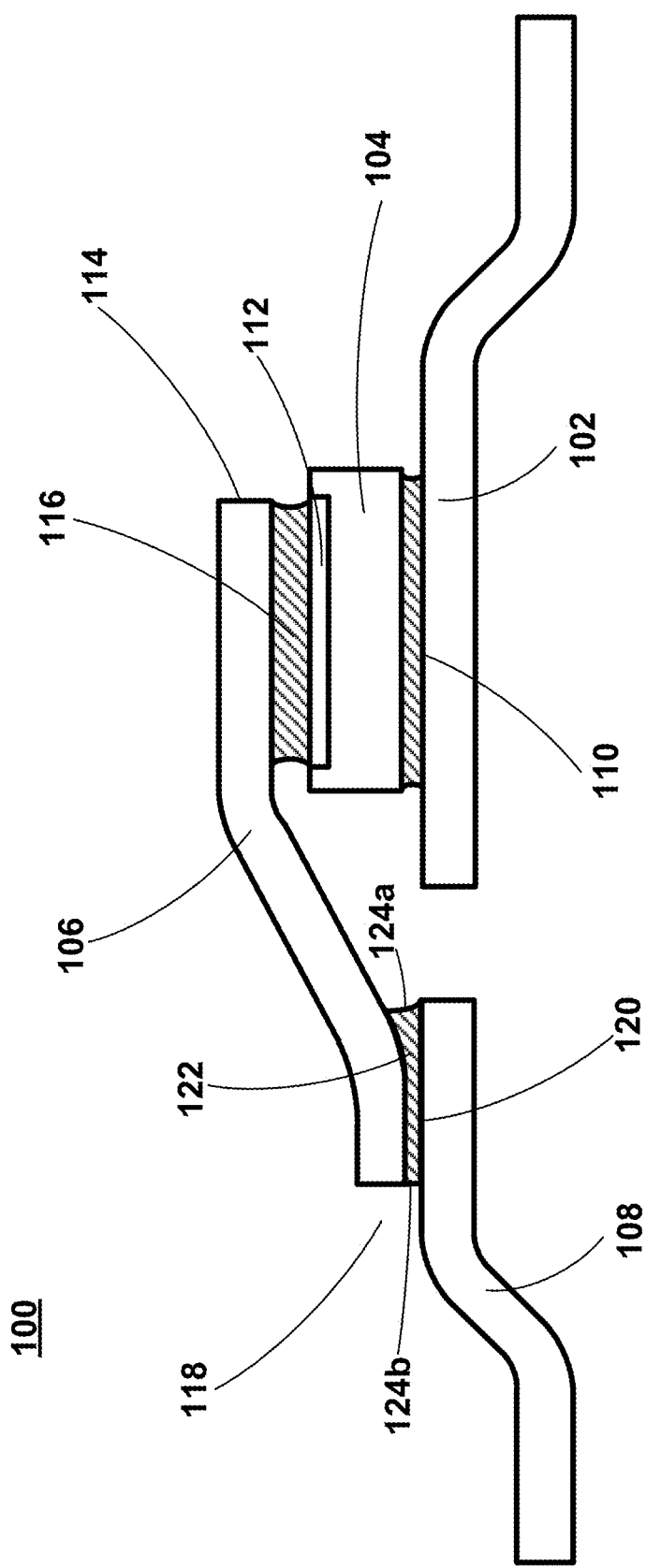
FIG. 1a schematically illustrates a cross-section view of a portion of a known electronic device.

Comparing a bonding joint formed by the bonding material 220 between the connector 212 and the connector-pad 224 of FIG. 2 with a bonding joint formed by bonding material 122 between the connector 106 and the connector-pad 120 of FIG. 1a, it will be appreciated that the footprint of the bonding joints are substantially the same. Assuming a same spacing between connector-pad 224 and connector 212 (at its closest point to connector-pad 224), and between connector 106 and the connector-pad 120, it will also be appreciated that the volume of the bonding joint in FIG. 2 is greater than that of FIG. 1a.

Increasing the thickness, or volume, of bonding material between connector and connector-pad, while keeping the overall footprint the same may increase the strength of the bonding joint, because the bonding joint contains more bonding material and the elastic and plastic deformation during thermo-mechanic stresses may be reduced.

Figure 1B:
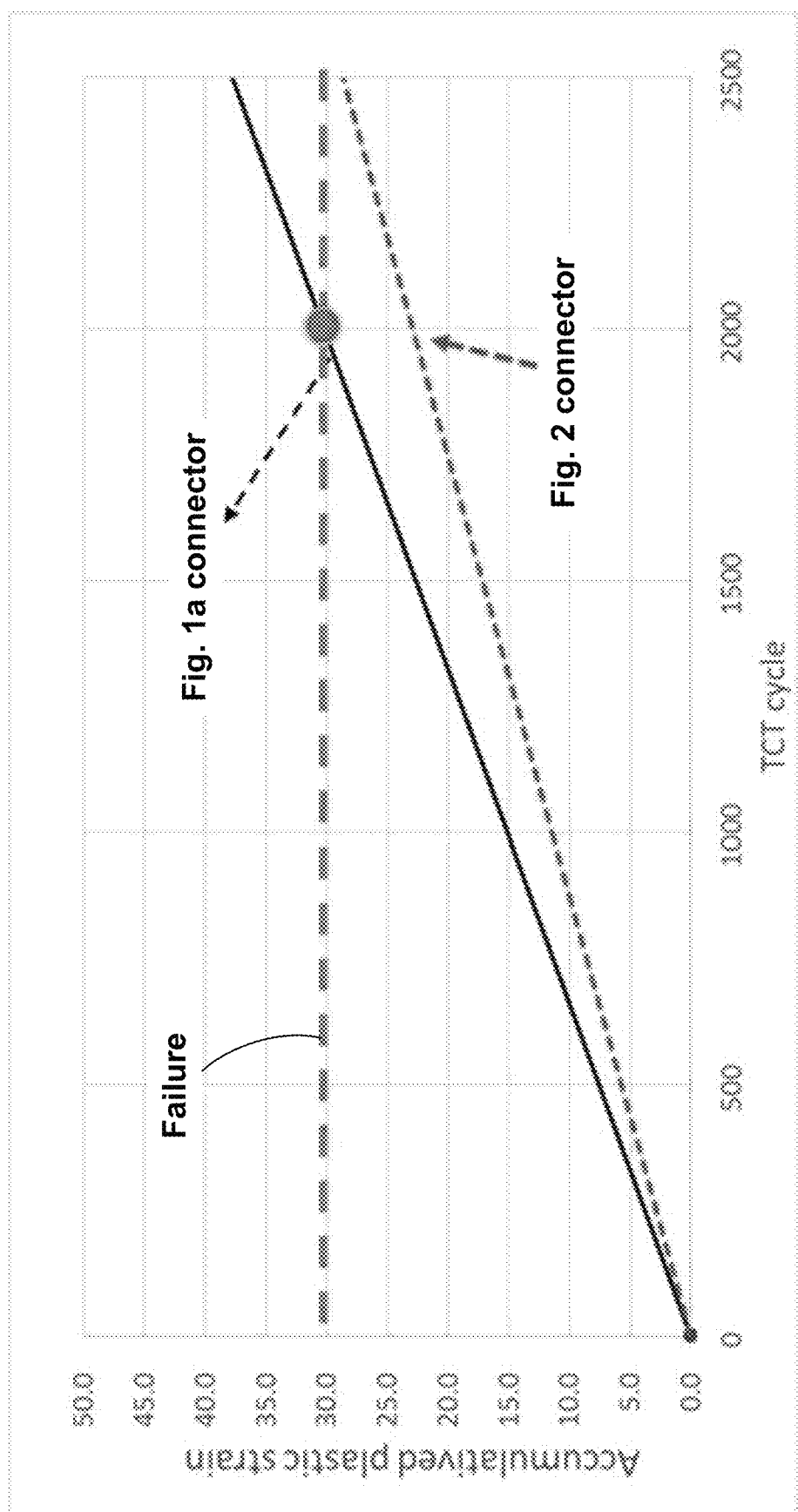
FIG. 1b illustrates a graph showing simulation data of accumulated plastic strain of a bonding material between a connector and connector pad for a known connector and for a connector according to one or more embodiments of the present invention.

FIG. 1b illustrates simulation data that shows accumulated plastic strain of a bonding material (i.e. solder in the illustrated data) between a connector and a connector-pad for a known connector (such as that illustrated in FIG. 1a) and for a connector according to one or more embodiments of the present invention (e.g. as illustrated in FIG. 2). From the figure, it can be seen that accumulated plastic strain of solder at an end of the connector according to one or more embodiments of the invention (e.g. that illustrated in FIG. 2) is about 25% lower than that for the known connector (i.e. as shown in FIG. 1) under TCT. The data indicates that the design of the connector end of FIG. 2 may potentially pass 2500 TCT cycles (c.f. with a known connector, which can marginally pass 2000 TCT cycles).

Thus, configuring a surface of the connector that is to oppose the connector-pad so that larger volume regions are formed between connector and connector-pad (compared with previous "flat" arrangements e.g.as illustrated in FIG. 1a) can increase the volume of the bonding joint, but keep the footprint of the joint the same.

Also, the formation 226 illustrated in FIG. 2 may promote formation of concave surfaces 230a, 230b at the bonding material-atmosphere interface on both sides of the bonding joint. Thus, the bonding joint is generally symmetric.

The formation 226 that achieves this in the arrangement illustrated in FIG. 2 comprises a bend in the connector 210. However, in one or more other embodiments of the present invention, the formation may comprise recesses, channels, steps and/or other surface features that achieve a non-flat surface of the connector that is to face the connector-pad. Examples of these other features are described further below with reference to FIGS. 3 to 6.

Figure 3:
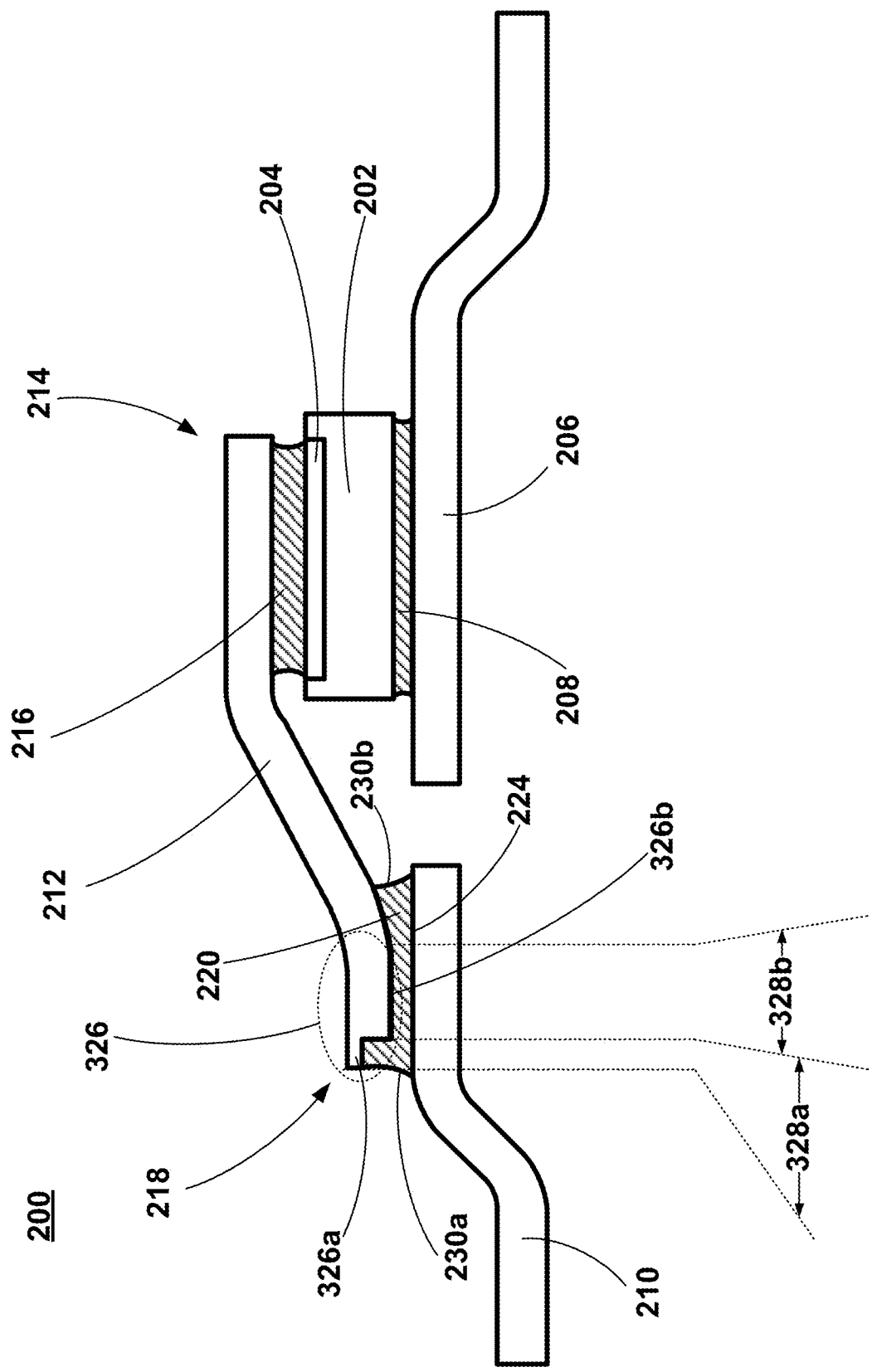
FIG. 3 schematically illustrates a cross-section view of a portion of an electronic device according to one or more embodiments of the present invention.

FIG. 3 illustrates an electronic device 200 according to one or more embodiments of the present invention in which another type of formation is employed. Features illustrated in FIG. 3 that are common to the electronic device 200 illustrated in FIG. 2 (and as described above) are denoted using like reference numerals.

In the illustrated electronic device 200 of FIG. 3, the lead-end 218 of connector 212 comprises a step formation 326. The step formation 326 in combination with the complementary surface defined by connector-pad 224 of lead 210 define therebetween a region into which the electrically conductive bonding material 220 can flow (when in a liquid state) and harden. The arrangement of the step formation 326 and opposing portion of the complementary surface defined by connector-pad 224 serves to attract, by capillary action, the electrically conductive bonding material 220 into the region therebetween. This causes the electrically conductive bonding material 220, when in a liquid state, to flow into the space and consolidate around the step formation 326 and the complementary surface defined by connector-pad 224.

The step formation 326 comprises a step formed at a tip of the lead-end 218 so that an overhang 326a is formed with a recess below. Thus, a spacing between the overhang 326a and the connector-pad 224 is greater than a spacing between the connector-pad 224 and a portion 326b of the connector 212 toward a die-end 214 of connector 212. The overhang 326a and recess extend across the width of the tip of the lead-end 218 of connector 212.

A volume partially bounded by the step formation 326 and a portion of the complementary surface defined by the connector-pad 224 that opposes the step formation 326 comprises two regions. These two regions comprise: a first region 328a partially defined by the overhang 326a of the step formation 326 and a portion of the complementary surface of the lead 210 opposing the overhang 326a; and a second region 328b partially defined by the portion 326b of the connector 212 and a portion of the complementary surface of the lead opposing the portion 326b.

As with the bend formation 226 of the electronic device 200 illustrated in FIG. 2, the step formation 326 of the electronic device 200 illustrated in FIG. 3 provides a surface of the connector that is to oppose the connector-pad that, in combination with the complementary surface of the connector-pad, defines larger volume regions between connector and connector-pad (compared with previous "flat" arrangements e.g. as illustrated in FIG. 1a). This can increase the volume of the bonding joint, but keep the footprint of the joint the same.

Also, similar to the bend formation 226 of FIG. 2, the step formation 326 of FIG. 3 may promote formation of concave surfaces 230a, 230b at the bonding material-atmosphere interface on both sides of the bonding joint. Again, this may lead to a bonding joint that is generally symmetric.

Figure 4A:
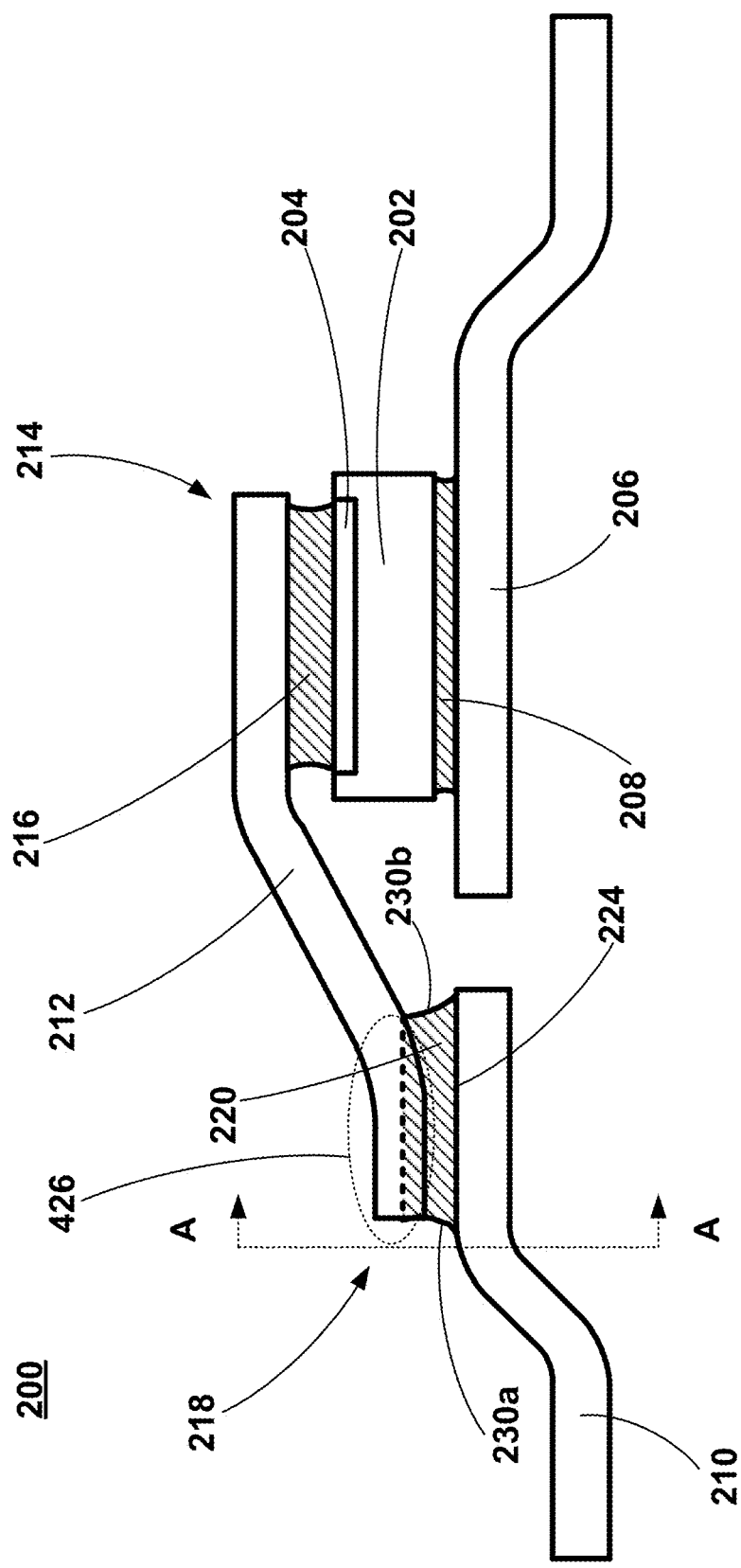
FIG. 4a schematically illustrates a cross-section view of a portion of an electronic device according to one or more embodiments of the present invention.
Figure 4B:
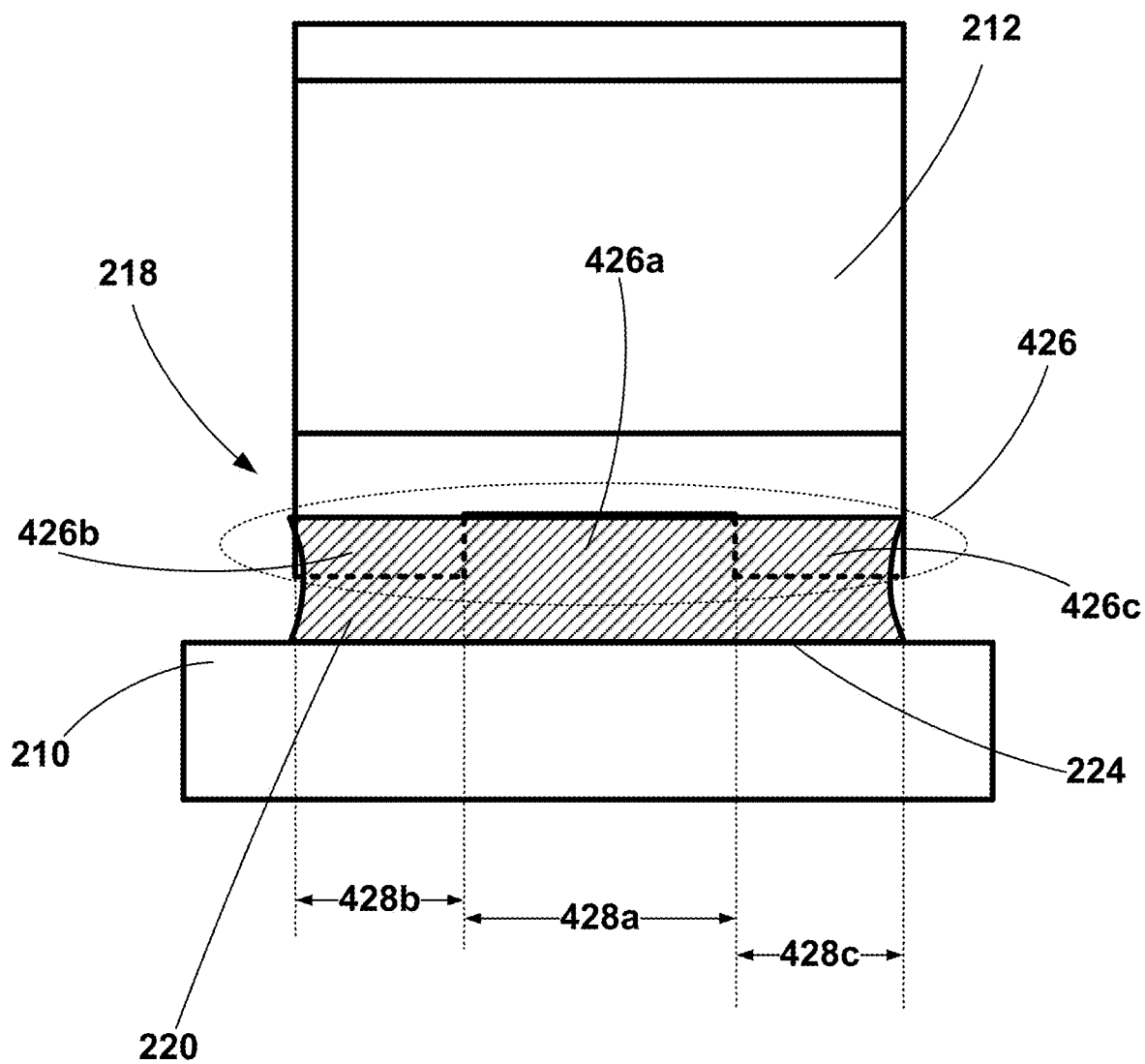
FIG. 4b schematically illustrates a cross-section view, viewed along line A-A as indicated in FIG. 4a, of a portion of an electronic device according to one or more embodiments of the present invention.
Figure 4C:
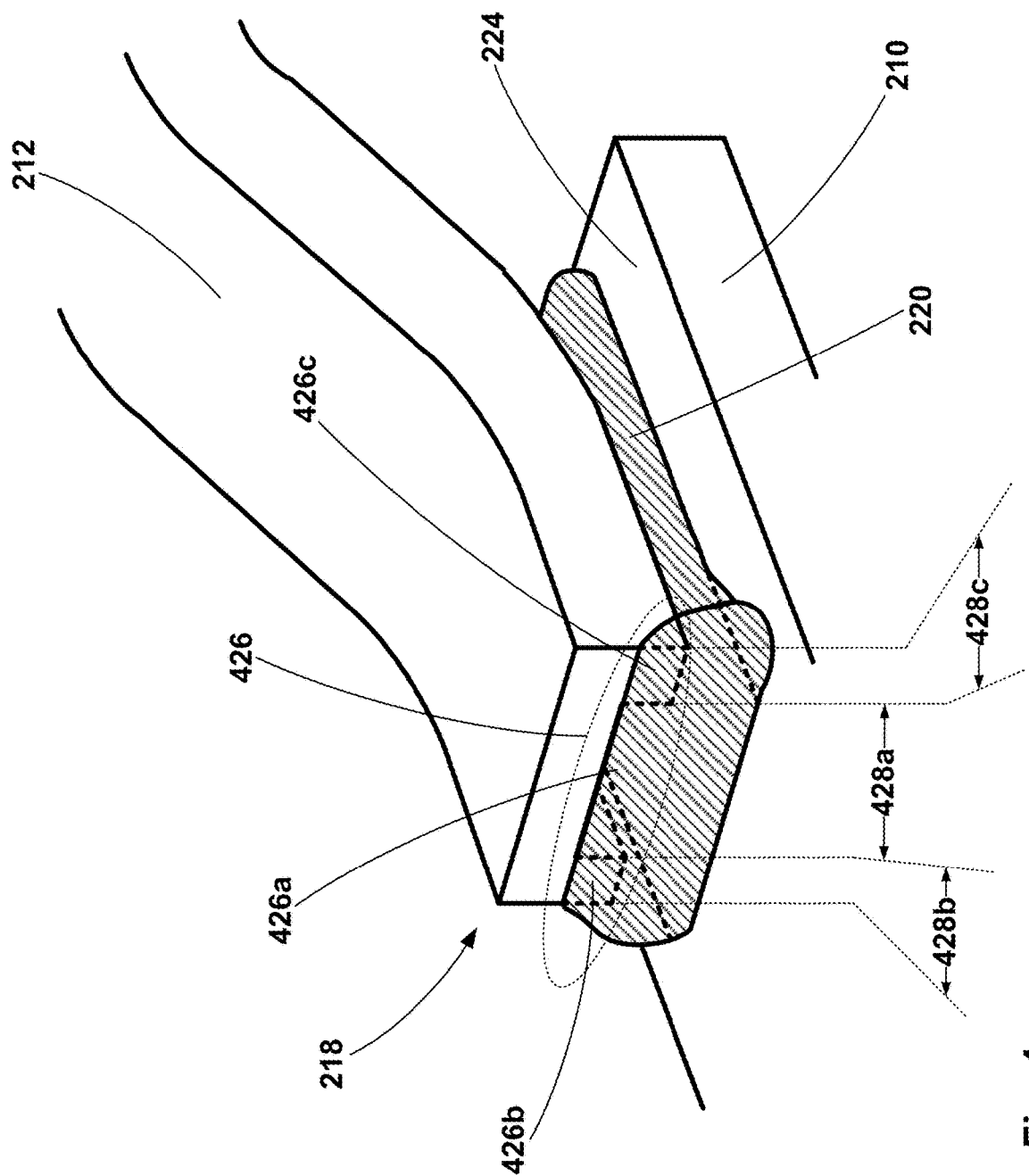

FIGS. 4a to 4c illustrate an electronic device 200 according to one or more embodiments of the present invention in which another type of formation is employed. Features illustrated in FIGS. 4a to 4c that are common to the electronic devices 200 illustrated in FIGS. 2 and 3 (and as described above) are denoted using like reference numerals.

In the illustrated electronic device 200 of FIGS. 4a to 4c, the lead-end 218 of connector 212 comprises a channel formation 426. The channel formation 426 in combination with the complementary surface defined by connector-pad 224 of lead 210 define therebetween a region into which the electrically conductive bonding material 220 can flow (when in a liquid state) and harden. The arrangement of the channel formation 426 and opposing portion of the complementary surface defined by connector-pad 224 serves to attract, by capillary action, the electrically conductive bonding material 220 into the region therebetween. This causes the electrically conductive bonding material 220, when in a liquid state, to flow into the space and consolidate around the channel formation 426 and the complementary surface defined by connector-pad 224.

The channel formation 426 comprises a channel 426a formed between first and second peaks 426b, 426c. The channel 426a and peaks 426b, 426c are formed in a surface of the lead-end 218 that is to oppose the connector-pad 224. The channel 426a and peaks 426b, 426c extend along a length of the surface of the lead-end 218, i.e. in a direction from a tip of the lead-end 218 toward a die-end 214 of the connector 212. In such an arrangement, a spacing between a base of the channel 426a and the connector-pad 224 is greater than a spacing between the peaks 426b, 426c and the connector-pad 224.

A volume partially bounded by the channel formation 426 and a portion of the complementary surface defined by the connector-pad 224 that opposes the channel formation 426 comprises three regions. These three regions comprise: a first region 428a partially defined by the channel 426a and a portion of the complementary surface of the lead 210 opposing the channel 426a; a second region 428b partially defined by a first peak 426b of the channel formation 426 and a portion of the complementary surface of the lead 210 opposing the first peak 426b; and a third region 428c partially defined by a second peak 426c and a portion of the complementary surface of the lead 210 opposing the second peak 426c.

As with the bend formation 226 and step formation 326 of the electronic devices 200 illustrated in FIGS. 2 and 3 respectively, the channel formation 426 of the electronic device 200 illustrated in FIGS. 4a to 4c provides a surface of the connector that is to oppose the connector-pad that, in combination with the complementary surface of the connector-pad, defines larger volume regions between connector and connector-pad (compared with previous "flat" arrangements e.g. as illustrated in FIG. 1a). This can increase the volume of the bonding joint, but keep the footprint of the joint the same.

Also, similar to the bend formation 226 of FIG. 2 and the step formation 326 of FIG. 3, the channel formation 426 of FIGS. 4a to 4c may promote formation of concave surfaces 230a, 230b at the bonding material-atmosphere interface on both sides of the bonding joint. Again, the bonding joint may be generally symmetric.

Figure 5:
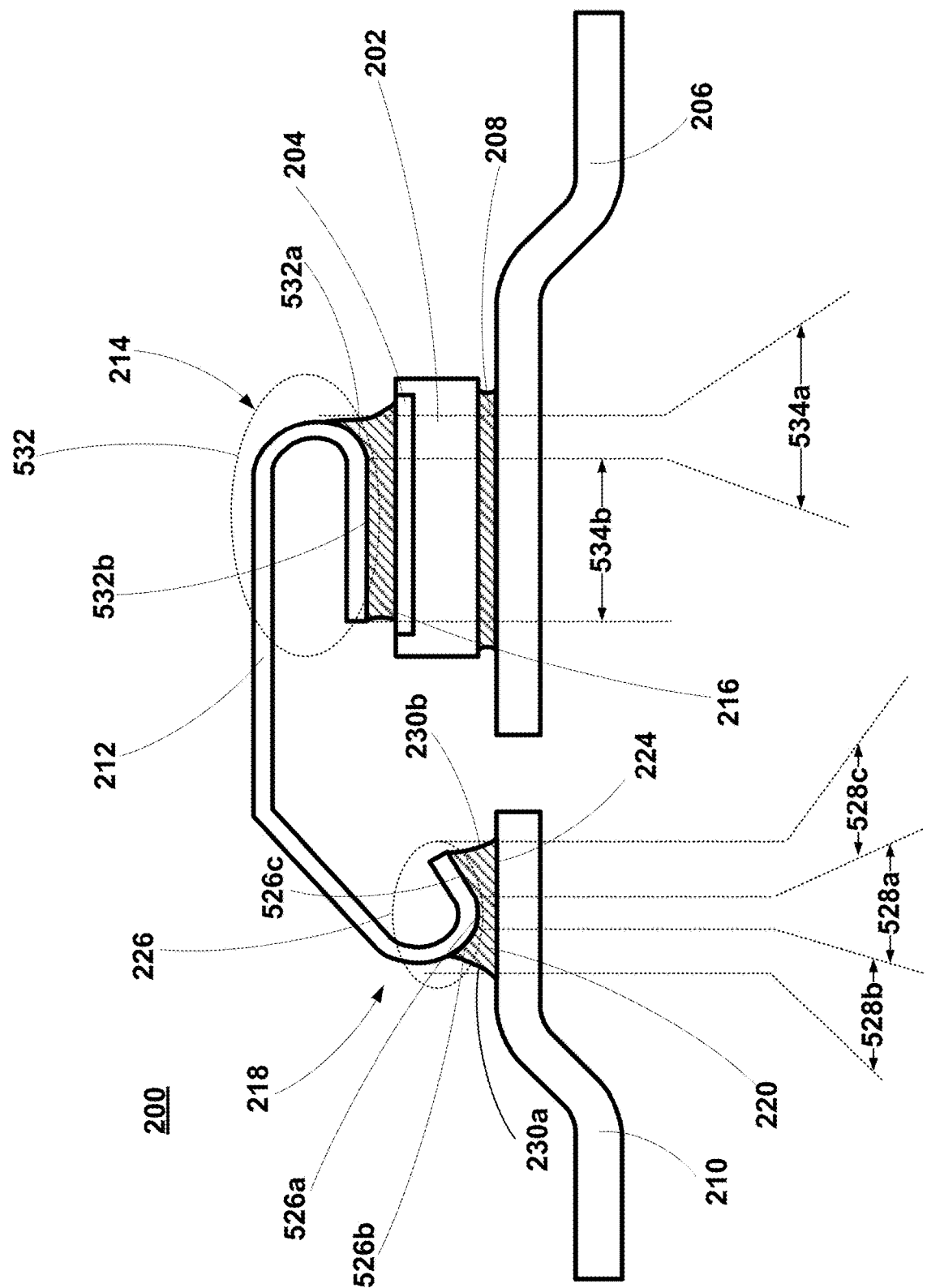
FIG. 5 schematically illustrates a cross-section view of a portion of an electronic device according to one or more embodiments of the present invention.

FIG. 5 illustrates an electronic device 200 according to one or more embodiments of the present invention in which other types of formation are employed. Features illustrated in FIG. 5 that are common to the electronic devices 200 illustrated in FIGS. 2, 3, and 4a to 4c (and as described above) are denoted using like reference numerals.

In the illustrated electronic device 200 of FIG. 5, the lead-end 218 of connector 212 comprises a first bend formation 526. Also, the die-end 214 of connector 212 comprises a second bend formation 532.

The first bend formation 526 in combination with the complementary surface defined by connector-pad 224 of lead 210 define therebetween a region into which the electrically conductive bonding material 220 can flow (when in a liquid state) and harden. The arrangement of the bend formation 526 and opposing portion of the complementary surface serves to attract, by capillary action, the electrically conductive bonding material 220 into the region therebetween. This causes the electrically conductive bonding material 220, when in a liquid state, to flow into the space and consolidate around the bend formation 526 and the complementary surface defined by connector-pad 224.

Likewise, the second bend formation 532 in combination with the complementary surface defined by contact 204 of die 202 define therebetween a region into which the electrically conductive bonding material 216 can flow (when in a liquid state) and harden. The arrangement of the second bend formation 532 and opposing portion of the complementary surface serves to attract, by capillary action, the electrically conductive bonding material 216 into the region therebetween. This causes the electrically conductive bonding material 216, when in a liquid state, to flow into the space and consolidate around the second bend formation 532 and the complementary surface defined by contact 204.

The first bend formation 526 comprises a first portion of an end region of the lead-end 218 that extends in a direction out of a plane of the connector toward the lead 210 and a second portion of the end region of the lead-end 218, remote from the die-end 214, which extends in a direction out of a plane of the first portion away from the lead 210.

The second bend formation 532 comprises a first portion of an end region of the die-end 214 that extends in a direction out of a plane of the connector toward the contact 204 and a second portion of the end region of the die-end 214, remote from the lead-end 218, which extends in a direction out of a plane of the first portion.

A volume partially bounded by the first bend formation 526 and a portion of the complementary surface defined by the connector-pad 224 that opposes the bend formation 526 comprises three regions. These three regions comprise: a first region 528a partially defined by an apex 526a of the first bend formation 526 and a portion of the complementary surface of the lead 210 opposing the apex 526a; a second region 528b partially defined by a first portion 526b of the connector 212 adjacent the apex 526a and a portion of the complementary surface of the lead opposing the first portion 526b; and a third region 528c partially defined by a second portion 526c of the connector adjacent the apex 526a and a portion of the complementary surface of the lead 210 opposing the second portion 526c.

As with the bend formation 226, step formation 326 and channel formation 426 of the electronic devices 200 illustrated in FIGS. 2, 3 and 4a to 4c respectively, the first bend formation 526 of the electronic device 200 illustrated in FIG. 5 provides a surface of the connector that is to oppose the connector-pad that, in combination with the complementary surface of the connector-pad, defines larger volume regions between connector and connector-pad (compared with previous "flat" arrangements e.g. as illustrated in FIG. 1a). This can increase the volume of the bonding joint, but keep the footprint of the joint the same.

Also, similar to the bend formation 226 of FIG. 2, the step formation 326 of FIG. 3, and the channel formation 426 of FIGS. 4a to 4c, the first bend formation 526 of FIG. 5 may promote formation of concave surfaces 230a, 230b at the bonding material-atmosphere interface on both sides of the bonding joint. Again, the bonding joint may be generally symmetric.

A volume partially bounded by the second bend formation 532 and a portion of the complementary surface defined by the contact 204 that opposes the second bend formation 532 comprises two regions. These two regions comprise: a first region 534a partially defined by a first portion 532a of the connector 212 (between the apex of the bend and a second portion 532b of the connector toward the tip of the connector 212 at the die-end 214) and a portion of the complementary surface of the contact 204 opposing the first portion 532a; and a second region 534b partially defined by the second portion 532b of the connector 212 and a portion of the complementary surface of the contact 204 opposing the second portion 532b.

As with the bend formation 226, step formation 326 and channel formation 426 of the electronic devices 200 illustrated in FIGS. 2, 3 and 4a to 4c respectively, the second bend formation 532 of the electronic device 200 illustrated in FIG. 5 provides a surface of the connector that is to oppose the contact 204 that, in combination with the complementary surface of the contact 204, defines larger volume regions between connector and contact 204 (compared with previous "flat" arrangements e.g. as illustrated in FIG. 1a). This can increase the volume of the bonding joint, but keep the footprint of the joint the same.

Also, similar to the bend formation 226 of FIG. 2, the step formation 326 of FIG. 3, and the channel formation of FIGS. 4a to 4c, the second bend formation 532 of FIG. 5 may promote formation of concave surfaces at the bonding material-atmosphere interface on both sides of the bonding joint. Again, the bonding joint may be generally symmetric.

Figure 6:
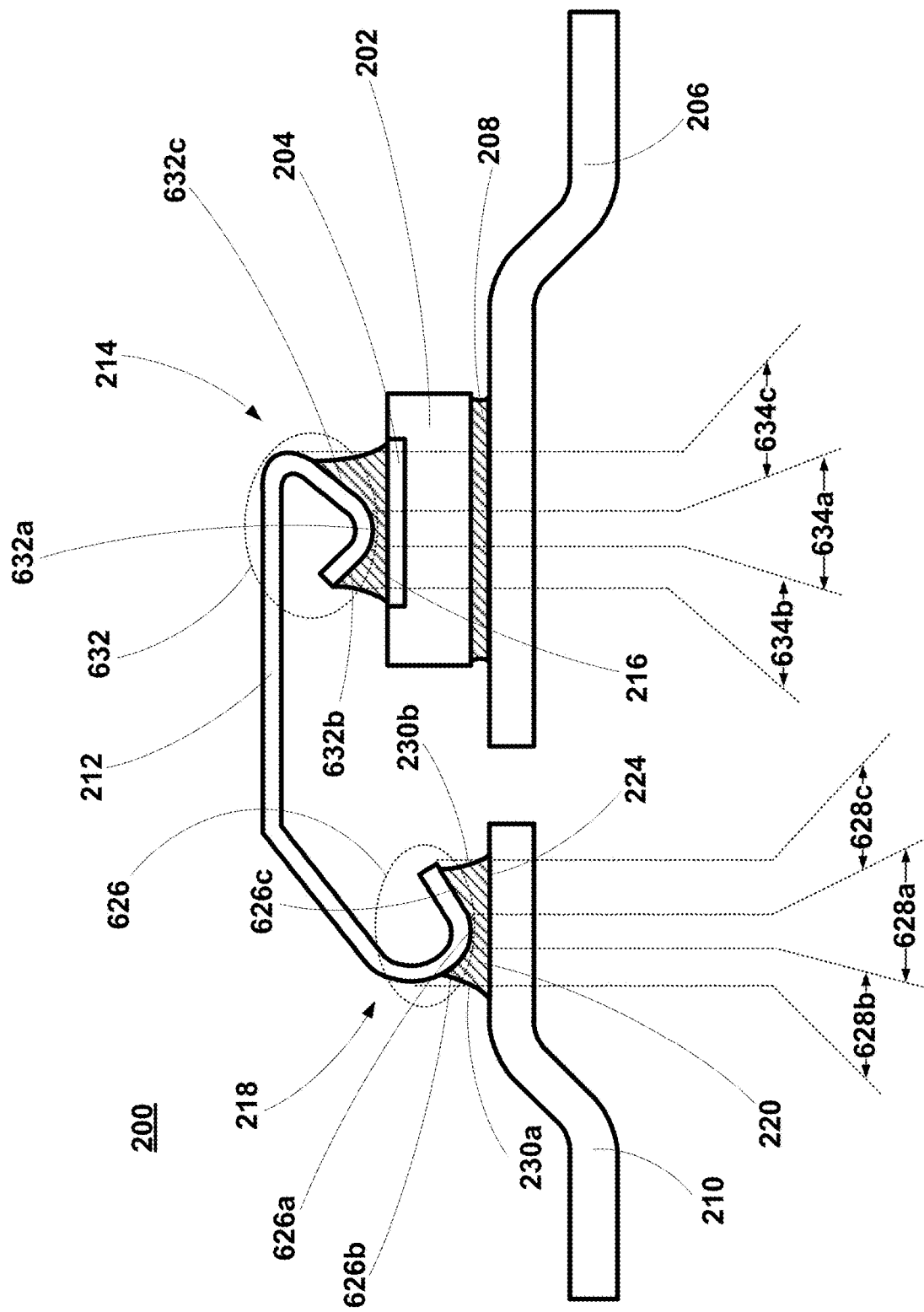
FIG. 6 schematically illustrates a cross-section view of a portion of an electronic device according to one or more embodiments of the present invention.

FIG. 6 illustrates an electronic device 200 according to one or more embodiments of the present invention in which other types of formation are employed. Features illustrated in FIG. 6 that are common to the electronic devices 200 illustrated in FIGS. 2, 3, 4a to 4c and 5 (and as described above) are denoted using like reference numerals.

In the illustrated electronic device 200 of FIG. 6, the lead-end 218 of connector 212 comprises a first bend formation 626. Also, the die-end 214 of connector 212 comprises a second bend formation 632.

The first bend formation 626 in combination with the complementary surface defined by connector-pad 224 of lead 210 define therebetween a region into which the electrically conductive bonding material 220 can flow (when in a liquid state) and harden. The arrangement of the first bend formation 626 and opposing portion of the complementary surface serves to attract, by capillary action, the electrically conductive bonding material 220 into the region therebetween. This causes the electrically conductive bonding material 220, when in a liquid state, to flow into the space and consolidate around the first bend formation 626 and the complementary surface defined by connector-pad 224.

Likewise, the second bend formation 632 in combination with the complementary surface defined by contact 204 of die 202 define therebetween a region into which the electrically conductive bonding material 216 can flow (when in a liquid state) and harden. The arrangement of the second bend formation 632 and opposing portion of the complementary surface serves to attract, by capillary action, the electrically conductive bonding material 216 into the region therebetween. This causes the electrically conductive bonding material 216, when in a liquid state, to flow into the space and consolidate around the second bend formation 632 and the complementary surface defined by contact 204.

The first bend formation 626 comprises a first portion of an end region of the lead-end 218 that extends in a direction out of a plane of the connector toward the lead 210 and a second portion of the end region of the lead-end 218, remote from the die-end 214, which extends in a direction out of a plane of the first portion away from the lead 210.

The second bend formation 632 comprises a first portion of an end region of the die-end 214 that extends in a direction out of a plane of the connector toward the contact 204 and a second portion of the end region of the lead-end 218, remote from the lead-end 218, which extends in a direction out of a plane of the first portion away from the contact 204.

A volume partially bounded by the first bend formation 626 and a portion of the complementary surface defined by the connector-pad 224 that opposes the first bend formation 626 comprises three regions. These three regions comprise: a first region 628a partially defined by an apex 626a of the first bend formation 626 and a portion of the complementary surface of the lead 210 opposing the apex 626a; a second region 628b partially defined by a first portion 626b of the connector 212 adjacent the apex 626a and a portion of the complementary surface of the lead opposing the first portion 626b; and a third region 628c partially defined by a second portion 626c of the connector adjacent the apex 626a and a portion of the complementary surface of the lead 210 opposing the second portion 626c.

As with the bend formation 226, step formation 326, channel formation 426 and bend formations 526, 532 of the electronic devices 200 illustrated in FIGS. 2, 3, 4a to 4c and 5 respectively, the first bend formation 626 of the electronic device 200 illustrated in FIG. 6 provides a surface of the connector that is to oppose the connector-pad that, in combination with the complementary surface of the connector-pad, defines larger volume regions between connector and connector-pad (compared with previous "flat" arrangements e.g. as illustrated in FIG. 1a). This can increase the volume of the bonding joint, but keep the footprint of the joint the same.

Also, similar to the bend formation 226 of FIG. 2, the step formation 326 of FIG. 3, the channel formation 426 of FIGS. 4a to 4c, and the bend formations 526, 532 of FIG. 5, the first bend formation 626 of FIG. 6 may promote formation of concave surfaces 230a, 230b at the bonding material-atmosphere interface on both sides of the bonding joint. Again, the bonding part is generally symmetric.

A volume partially bounded by the second bend formation 632 and a portion of the complementary surface defined by the contact 204 that opposes the second bend formation 632 comprises three regions. These three regions comprise: a first region 634a partially defined by an apex 632a of the second bend formation 632 and a portion of the complementary surface of the contact 204 opposing the apex 632a; a second region 634b partially defined by a first portion 632b of the connector 212 adjacent the apex 632a and a portion of the complementary surface of the contact 204 opposing the first portion 632b; and a third region 634c partially defined by a second portion 632c of the connector adjacent the apex 632a and a portion of the complementary surface of the contact 204 opposing the second portion 632c.

As with the bend formation 226, step formation 326, channel formation 426 and bend formations 526, 532 of the electronic devices 200 illustrated in FIGS. 2, 3, 4a to 4c and 5 respectively, the second bend formation 632 of the electronic device 200 illustrated in FIG. 6 provides a surface of the connector that is to oppose the contact 204 that, in combination with the complementary surface of the contact 204, defines larger volume regions between connector and contact 204 (compared with previous "flat" arrangements e.g. as illustrated in FIG. 1a). This can increase the volume of the bonding joint, but keep the footprint of the joint the same.

Also, similar to the bend formation 226 of FIG. 2, the step formation 326 of FIG. 3, the channel formation 426 of FIGS. 4a to 4c, and the bend formations 526, 532 of FIG. 5, the second bend formation 632 of FIG. 6 may promote formation of concave surfaces at the bonding material-atmosphere interface on both sides of the bonding joint. Again, the bonding joint is generally symmetric.

In the above described one or more embodiments, the lead-end 218 of connector 212 comprises a formation 226, 326, 426, 526, 626. Optionally, the die-end 214 of connector 212 may comprise a formation 532, 632. Further optionally, both the lead-end 218 and die-end 214 of connector may comprise a formation. A lead-end of a connector may be provided with a formation of at least one of the types described above. Similarly, a die-end of a connector may be provided with a formation of at least one of the types described above. Where a formation is provided at both a lead-end and a die-end of a connector, the formations may be of a same type, or a different type at each end.

In the above described one or more embodiments, the lead-end 218 of connector 212 comprises a step formation 326 in which the overhang 326a and recess extend across the width of the tip of the lead-end 218 of connector 212. Optionally, the overhang 326a and recess extend partially across the width of the tip of the lead-end 218 of connector 212.

In the above described one or more embodiments, the lead-end 218 of connector 212 comprises a channel formation 426 in which the channel 426a and peaks 426b, 426c extend across an entire length of the surface of the lead-end 218 that is to oppose the connector-pad 224. Optionally, the channel 426a and peaks 426b, 426c extend partially across the length of the surface of the lead-end 218 that is to oppose the connector-pad 224.

Optionally, the bend formation may comprise a J-bend or a V-bend.

Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

The invention claimed is:

1. An electronic device comprising:
   a die;
   at least one lead; and
   at least one connector, the at least one connector for connecting the die to the corresponding at least one lead, the at least one connector comprising a first end disposed in bondable proximity to a complementary surface of the corresponding at least one lead and a second end disposed in bondable proximity to a complementary surface of the die;
   wherein the first end has an end portion that comprises a formation comprising a bend out of a plane of the connector so that a portion of the end portion of the first end extends in a direction out of the plane of the connector; and a rounded apex in the bondable proximity to the complementary surface of the at least one lead that defines a first region and at least one second region between the formation and the complementary surface of the at least one lead so that the first region and the at least one second region are configured to attract by capillary action an electrically conductive bonding material to consolidate therein.

2. The electronic device according to claim 1, wherein the end portion of the first end extends in a direction out of the plane of the connector away from the at least one lead.

3. The electronic device according to claim 2, further comprising a third region, wherein the second region and the third region are located on either side of the first region, wherein the first region is partially defined by the rounded apex of the bend and a portion of the complementary surface of the at least one lead opposing the rounded apex, the second region is partially defined by a first portion of the connector adjacent the rounded apex and a portion of the complementary surface of the at least one lead opposing the first portion, and the third region is partially defined by a second portion of the connector adjacent the rounded apex and a portion of the complementary surface of the at least one lead opposing the second portion.

4. An electronic device comprising:
a die;
at least one lead; and
at least one connector, the at least one connector for connecting the die to the corresponding at least one lead, the at least one connector comprising a first end disposed in bondable proximity to a complementary surface of the corresponding at least one lead and a second end disposed in bondable proximity to a complementary surface of the die, the first end having an end portion that comprises a formation that defines a first region and at least one second region between the formation and the complementary surface of the at least one lead, the formation comprising at the first end a step formed in a tip of the first end, the step extending partly across a width of the first end so that the second region is partially defined by a first part of the step and a portion of the complementary surface of the at least one lead opposing the first part, and the first region is partially defined by a second part of the step and a portion of the complementary surface of the at least one lead opposing the second part, wherein the first region and the at least one second region are configured to attract by capillary action an electrically conductive bonding material to consolidate therein.

5. An electronic device comprising:
a die;
at least one lead; and
at least one connector, the at least one connector for connecting the die to the corresponding at least one lead, the at least one connector comprising a first end disposed in bondable proximity to a complementary surface of the corresponding at least one lead and a second end disposed in bondable proximity to a complementary surface of the die, the first end having an end portion that comprises a formation that defines a first region and at least one second region between the formation and the complementary surface of the at least one lead, the formation comprising a first peak and a second peak with a channel therebetween in the first end, the first and second peaks and the channel in a surface of the first end opposing the complementary surface of the corresponding at least one lead and extending partly across a length of the first end, and wherein the second region is partially defined by the channel and a portion of the complementary surface of the at least one lead opposing the channel, and the first region is partially defined by the first and second peaks and portions of the complementary surface of the lead opposing the peaks.

6. The electronic device according to claim 1, wherein the portion of the end portion of the formation comprises a first portion and a second portion, and the formation at the first end comprises a bend out of a plane of the connector so that the first portion of the end portion of the first end extends in a direction out of a plane of the connector toward the at least one lead and a second portion of the end portion of the first end, remote from the second end, and extends in a direction out of a plane of the first portion away from the at least one lead.

7. The electronic device of claim 1, comprising a formation at the second end defining a first region and at least one second region, the first region and the at least one second region being configured to attract by capillary action an electrically conductive bonding material to consolidate therein, wherein the formation at the second end comprises a bend out of a plane of the connector so that a portion of an end region of the second end extends in a direction out of the plane of the connector.

8. The electronic device of claim 7, wherein the end region of the second end extends in a direction out of the plane of the connector away from the die.

9. The electronic device according to claim 7, further comprising the formation at the second end further defining a third region, the second region and third region being located on either side of the first region, the first region being partially defined by an apex of the bend and a portion of the complementary surface of the die opposing the apex, the second region being partially defined by a first portion of the connector adjacent the apex and a portion of the complementary surface of the die opposing the first portion, and the third region being partially defined by a second portion of the connector adjacent the apex and a portion of the complementary surface of the die opposing the second portion.

10. An electronic device comprising:
a die;
at least one lead; and
at least one connector, the at least one connector for connecting the die to the corresponding at least one lead, the at least one connector comprising a first end disposed in bondable proximity to a complementary surface of the corresponding at least one lead and a second end disposed in bondable proximity to a complementary surface of the die, the second end having an end portion that comprises a formation that defines a first region and at least one second region between the formation and the complementary surface of the die, the formation at the second end comprising a step formed in a tip of the second end, the step extending at least partly across a width of the second end, wherein the second region is partially defined by a first part of the step and a portion of the complementary surface of the die opposing the first part, and wherein the first region is partially defined by a second part of the step and a portion of the complementary surface of the die opposing the second part.

11. An electronic device comprising:
a die;
at least one lead; and
at least one connector, the at least one connector for connecting the die to the corresponding at least one lead, the at least one connector comprising a first end disposed in bondable proximity to a complementary surface of the corresponding at least one lead and a second end disposed in bondable proximity to a complementary surface of the die, the first end and the second end having an end portion that comprises a formation that defines a first region and at least one second region between the formation and the complementary surface of die, wherein the formation at the second end comprises a first peak and a second peak with a channel between the first and second peaks, wherein the first and second peaks and the channel are formed in a surface of the second end opposing the complementary surface of the corresponding at least one lead and extending at least partly across a length of the second end, and wherein the second region is partially defined by the channel and a portion of the complementary surface of the die opposing the channel, and the first region is partially defined by the peaks and portions of the complementary surface of the die opposing the peaks.

12. The electronic device of claim 1, wherein the formation at the second end comprises a bend out of a plane of the connector so that a first portion of an end region of the second end extends in a direction out of a plane of the connector toward the die and a second portion of the end region of the second end, remote from the first end, and extends in a direction out of a plane of the first portion away from the die.

13. The electronic device of claim 1, further comprising a power rectifier device or a transient voltage suppression device.

14. A connector for use in the electronic device of claim 1, the connector configured to connect a die to at least one lead of the electronic device, the connector comprising a first end for disposition in bondable proximity to a complementary surface of the at least one lead, and a second end for disposition in bondable proximity to a complementary surface of the die, wherein the first end has an end portion that comprises a formation comprising,
　a bend out of a plane of the connector so that a portion of the end portion of the first end extends in a direction out of the plane of the connector; and
　a rounded apex in the bondable proximity to the complementary surface of the at least one lead that defines a first region and at least one second region between the formation and the complementary surface of the at least one lead
　so that the first region and the at least one second region are configured to attract by capillary action an electrically conductive bonding material to consolidate therein.

* * * * *